United States Patent
Tanaka

(10) Patent No.: US 9,076,924 B2
(45) Date of Patent: Jul. 7, 2015

(54) SEMICONDUCTOR LIGHT EMITTING DEVICE

(75) Inventor: Akira Tanaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 13/598,373

(22) Filed: Aug. 29, 2012

(65) Prior Publication Data
US 2013/0153857 A1     Jun. 20, 2013

(30) Foreign Application Priority Data

Dec. 14, 2011   (JP) ................. P2011-273073

(51) Int. Cl.
| | |
|---|---|
| H01L 33/06 | (2010.01) |
| H01L 33/22 | (2010.01) |
| H01L 33/38 | (2010.01) |
| H01L 33/42 | (2010.01) |
| H01L 33/00 | (2010.01) |
| H01L 33/32 | (2010.01) |

(52) U.S. Cl.
CPC .............. *H01L 33/22* (2013.01); *H01L 33/0079* (2013.01); *H01L 33/06* (2013.01); *H01L 33/32* (2013.01); *H01L 33/38* (2013.01); *H01L 33/42* (2013.01); *H01L 2933/0083* (2013.01)

(58) Field of Classification Search
CPC ......... H01L 33/06; H01L 33/22; H01L 33/38; H01L 33/42; H01L 33/382
See application file for complete search history.

(56) References Cited

U.S. PATENT DOCUMENTS

| | | | | |
|---|---|---|---|---|
| 5,549,763 | A | * | 8/1996 | Sano et al. ................ 136/255 |
| 5,943,154 | A | * | 8/1999 | Nakayama .................. 359/244 |
| 7,061,065 | B2 | | 6/2006 | Horng et al. |
| 7,151,217 | B2 | * | 12/2006 | Forrest et al. ............... 136/263 |
| 2005/0012095 | A1 | * | 1/2005 | Niira et al. ..................... 257/41 |

(Continued)

FOREIGN PATENT DOCUMENTS

| | | |
|---|---|---|
| JP | 200012922 A | 1/2000 |
| JP | 2005226072 A | 8/2005 |

(Continued)

OTHER PUBLICATIONS

Japanese Office Action dated Jun. 20, 2014, filed in Japanese counterpart Application No. 2011-273073, 7 pages (with translation).

(Continued)

*Primary Examiner* — Benjamin Sandvik
*Assistant Examiner* — Fazli Erdem
(74) *Attorney, Agent, or Firm* — Patterson & Sheridan, LLP

(57) ABSTRACT

In one embodiment, a semiconductor light emitting device includes a stacked structure, a first electrode, a second electrode and a transparent conductive film. The stacked structure includes a first semiconductor layer with a first conductivity type, a light emitting layer and a second semiconductor layer with a second conductivity type which are formed and stacked directly or indirectly. The stacked structure is taken out light from the light emitting layer side to the second semiconductor layer side. The first electrode is connected to the first semiconductor layer. The second electrode is connected to a first principal surface of the second semiconductor layer which is exposed at the light emitting layer side. The second electrode is arranged in parallel with the first electrode. The transparent conductive film is provided so as to cover a second principal surface of the second semiconductor layer.

14 Claims, 15 Drawing Sheets

(56) References Cited

U.S. PATENT DOCUMENTS

| | | |
|---|---|---|
| 2007/0086496 A1* | 4/2007 | Tanaka et al. .............. 372/43.01 |
| 2010/0038669 A1* | 2/2010 | McKenzie ...................... 257/98 |
| 2010/0117070 A1* | 5/2010 | Adekore et al. ................ 257/43 |
| 2010/0133529 A1* | 6/2010 | Taraschi et al. ................. 257/43 |
| 2010/0213493 A1* | 8/2010 | Hsu et al. ........................ 257/98 |
| 2012/0007040 A1* | 1/2012 | Moon et al. ..................... 257/13 |
| 2012/0056158 A1* | 3/2012 | Iso et al. .......................... 257/13 |
| 2012/0261641 A1* | 10/2012 | Tanaka ........................... 257/13 |
| 2012/0273753 A1* | 11/2012 | Tanaka ........................... 257/13 |
| 2013/0112943 A1* | 5/2013 | Tanaka et al. ................... 257/13 |
| 2013/0187186 A1* | 7/2013 | Popp ............................... 257/99 |
| 2013/0292731 A1* | 11/2013 | Chen et al. ...................... 257/98 |

FOREIGN PATENT DOCUMENTS

| | | |
|---|---|---|
| JP | 2006156583 A | 6/2006 |
| JP | 2011-035275 | 2/2011 |
| JP | 2011096740 A | 5/2011 |
| WO | 2004073075 A1 | 8/2004 |
| WO | 2011010436 A1 | 1/2011 |

OTHER PUBLICATIONS

Japanese Office Action dated Januray 30, 2015, filed in Japanese counterpart Application No. 2011-273073, 6 pages (with translation).

* cited by examiner

SEMICONDUCTOR LIGHT EMITTING DEVICE

CROSS REFERENCE TO RELATED APPLICATION

This application is based upon and claims the benefit of priority from the prior Japanese Patent Application No. 2011-273073, filed on Dec. 14, 2011, the entire contents of which are incorporated herein by reference.

FIELD

Embodiments described herein relate to a semiconductor light emitting device.

BACKGROUND

In a semiconductor light emitting device, an electrode acts as a shielding material when light is taken out. For this reason, recently, a large number of semiconductor light emitting devices in which an electrode is not provided on a surface of a light extraction has been developed. The semiconductor light emitting device as referred to above, includes a stacked structure in which a P-type semiconductor layer, a MQW (Multiple Quantum Well) light emitting layer and an N-type semiconductor layer are formed and stacked, for example. An n-side electrode and a p-side electrode are provided on a supporting board. The semiconductor light emitting device is taken out light from a surface side of the N-type semiconductor layer.

In the semiconductor light emitting device, a current concentrates in a region near the n-side electrode and the p-side electrode, consequently, a carrier density increases in a narrow region. In a high output power semiconductor light emitting device, an overflow and a non radiative Auger recombination increase when the carrier density increases in the narrow region, therefore, a light emitting efficiency decreases.

DETAILED DESCRIPTION

Figure 1:
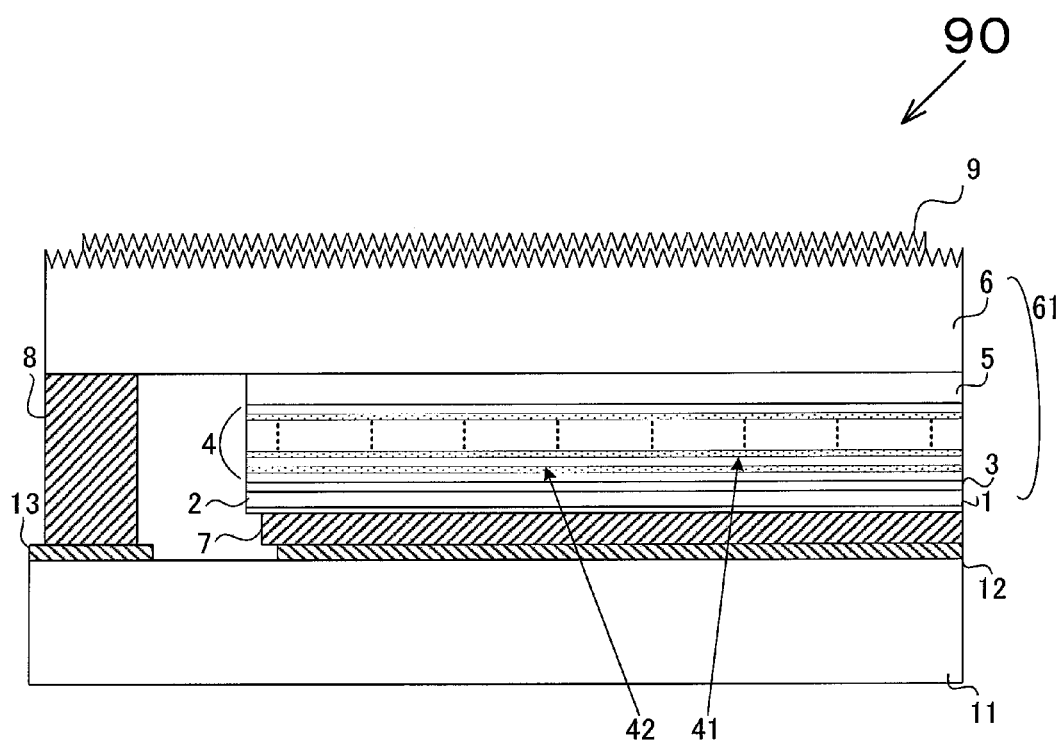
FIG. 1 is a cross-sectional view showing a semiconductor light emitting device according to a first embodiment.

In one embodiment, a semiconductor light emitting device includes a stacked structure, a first electrode, a second electrode and a transparent conductive film. The stacked structure includes a first semiconductor layer with a first conductivity type, a light emitting layer and a second semiconductor layer with a second conductivity type which are formed and stacked directly or indirectly. The stacked structure is taken out light from the light emitting layer side to the second semiconductor layer side. The first electrode is connected to the first semiconductor layer. The second electrode is connected to a first principal surface of the second semiconductor layer which is exposed at the light emitting layer side. The second electrode is arranged in parallel with the first electrode. The transparent conductive film is provided so as to cover a second principal surface of the second semiconductor layer.

Hereinafter, further plural examples are described with reference to the drawings. In the drawings, the same numeral indicates the same or similar portions.

Figure 2:
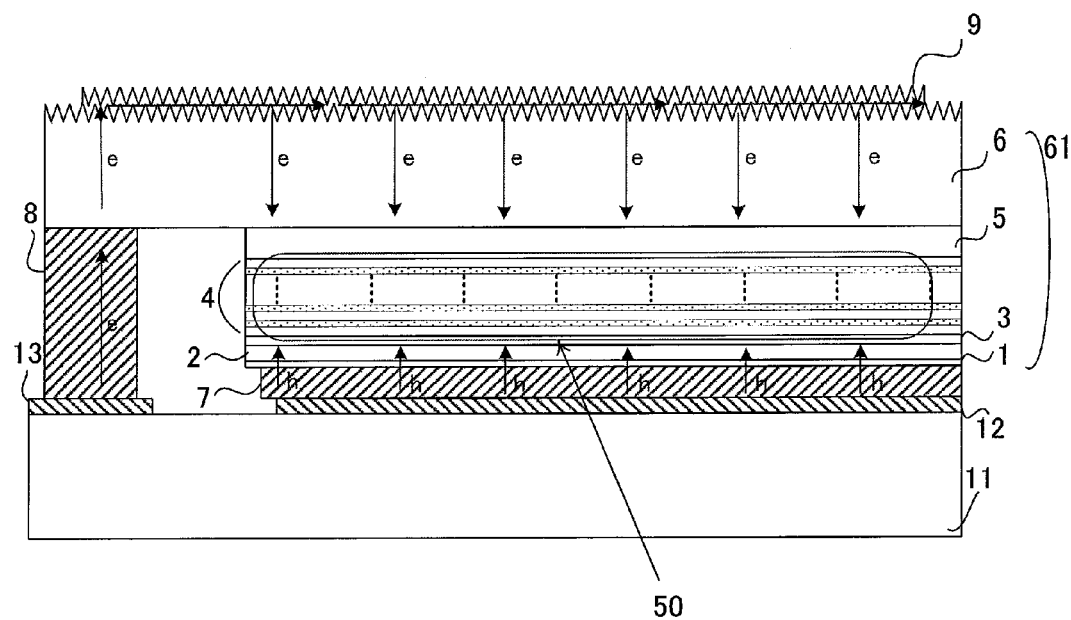
FIG. 2 is a view illustrating a behavior of an electron and a hole generated by the semiconductor light emitting device according to the first embodiment.
Figure 3:
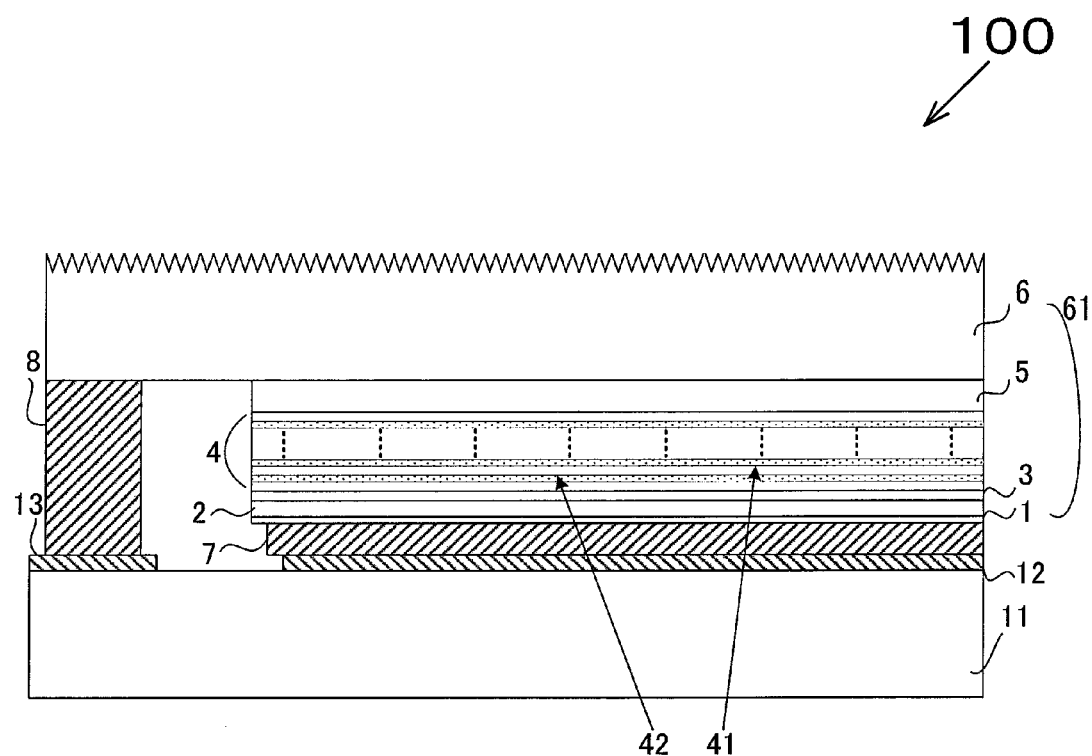
FIG. 3 is a cross-sectional view showing a semiconductor light emitting device of a comparative example according to the first embodiment.
Figure 4:
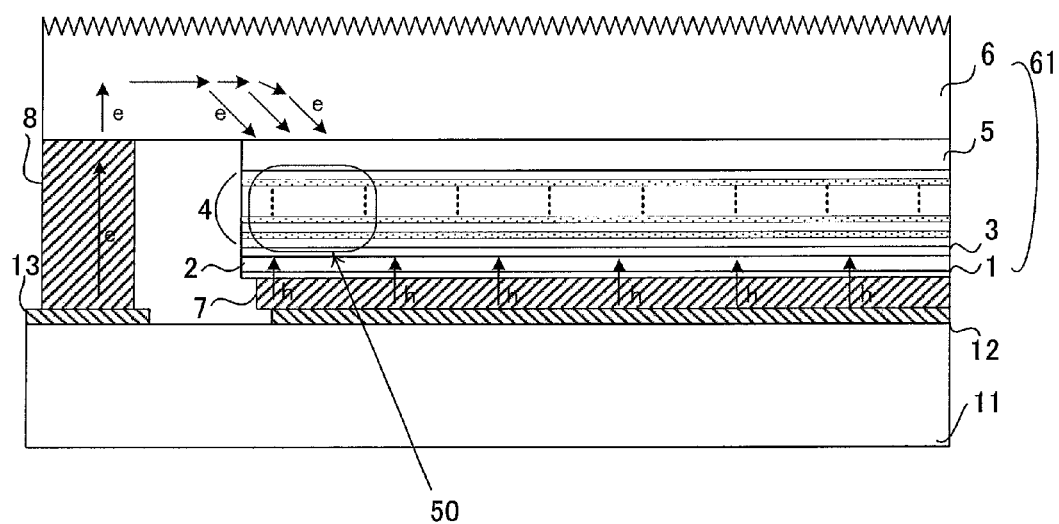
FIG. 4 is a view illustrating a behavior of an electron and a hole generated by the semiconductor light emitting device of the comparative example according to the first embodiment.

Descriptions will be provided for a semiconductor light emitting device of a first embodiment with reference to FIGS. 1 to 5. FIG. 1 is a cross-sectional view showing the semiconductor light emitting device. FIG. 2 is a view illustrating a behavior of an electron and a hole generated by the semiconductor light emitting device. (FIG. 3 is a cross-sectional view showing a semiconductor light emitting device of a comparative example. FIG. 4 is a view illustrating a behavior of an electron and a hole generated by the semiconductor light emitting device of the comparative example. FIG. 5 is a view illustrating a radiation and a non radiation generated by a semiconductor light emitting device. In the embodiment, a transparent conductive film is provided so as to cover an N-type clad layer. Therefore, it is possible to suppress an overflow and a non radiative Auger recombination in large current and to increase an optical output.

As shown in FIG. 1, a semiconductor light emitting device 90 includes a supporting board 11, a p-side supporting board electrode 12, an n-side supporting board electrode 13, a p-side electrode 7, an n-side electrode, a stacked structure 61 and a transparent conductive film 9. The semiconductor light emitting device 90 is a high output power GaN LED (light emitting diode), is used for illumination and the like.

In the semiconductor light emitting device 90, the p-side electrode 7 and the n-side electrode 8 are provided on the supporting board 11 side, light generated by a MQW (Multiple Quantum Well) light emitting layer 4 of the stacked structure 61 is taken out from an N-type clad layer 6 side. The p-side electrode functions as a reflection layer which reflects light generated by the MQW light emitting layer 4. The p-side electrode is made of silver Ag), for example.

The p-side supporting board electrode 12 is provided on the supporting board 11. The n-side supporting board 13 is provided away from the p-side supporting board electrode 12 on the supporting board 11. The p-side electrode 7 is formed so as to cover the p-side supporting board electrode 12 on the p-side supporting board electrode 12. The n-side electrode 8 is formed away from the p-side electrode 7 and the stacked structure 61 on the n-side supporting board electrode 13. An area of the p-side electrode 7 is larger than that of the n-side electrode. A carrier (hole) injected from the p-side electrode 7 may spread across the MQW light emitting layer 4. The p-side electrode 7 may be any one of a mesh shape, a thin wire shape and a dot shape. The p-side electrode 7 may be combined use of a transparent electrode and a reflection layer.

The stacked structure 61 is formed on the p-side electrode 7. The stacked structure 61 includes a P-type contact layer 1, a P-type clad layer 2, a P-type overflow suppressing layer 3, the MQW light emitting layer 4, a superlattice layer 5 and the N-type clad layer 6 which is formed and stacked using MOCVD (metal organic chemical vapor deposition), for example. An upper surface of the n-side electrode 8 is set as high as an upper surface of the superlattice layer 5. The N-type clad layer 6 is formed on the n-side electrode 8 and the superlattice layer 5. The P-type overflow suppressing layer 3 operates so-as to block a flow of an electron supplied from the n-side electrode 8 side.

The P-type contact layer 1 is a Pt-type GaN layer. The P-type contact layer 1 has an acceptor concentration with $1E21/cm^3$, a film thickness of the P-type contact layer 1 is set 5 nm, for example. The P-type clad layer 2 is a P-type GaN layer. The P-type clad layer 2 has an acceptor concentration with $1E20/cm^3$, a film thickness of the P-type clad layer 2 is set 100 nm, for example. The P-type overflow suppressing layer 3 is a P-type AlGaN layer. The P-type overflow suppressing layer 3 has an acceptor concentration with $1E20/cm^3$, a film thickness of the P-type overflow suppressing layer 3 is set 5 nm, for example. The MQW light emitting layer 4 is an undoped MQW light emitting layer with eight quantum wells. The quantum well is composed of a well layer 42 of an $In_{(X)}Ga_{(1-X)}N$ layer and a barrier layer 41 of an $In_{(y)}Ga_{(1-y)}N$ layer, a film thickness of the well layer 42 is 2.5 nm, a film thickness of the barrier layer 41 is 5 nm, for example. The superlattice layer 5 is an undoped superlattice layer with thirty quantum wells. The quantum well is composed of a well layer of an $In_{(L)}Ga_{(1-L)}N$ layer and a barrier layer of an $In_{(M)}Ga_{(1-M)}N$ layer, a film thickness of the well layer is 1 nm, a film thickness of the barrier layer is 3 nm, for example. The N-type clad layer 6 is an N-type GaN layer. The N-type clad layer 6 has a donor concentration with $1E19/cm^3$, a film thickness of the N-type clad layer 6 is set 4 nm, for example.

A concavo-convex shape with 1-2 μm depth is formed in a surface of the N-type clad layer 6. The concavo-convex shape is formed by a KOH solution, but may be formed using a patterning method and RIE (reactive ion etching), or an imprint method and RIE.

The transparent conductive film 9 is made of an ITO (indium thin oxide) film in which a film thickness is set 0.17 μm, for example. In a surface of the transparent conductive film 9, a concavo-convex shape is maintained in a reflection of the concavo-convex shape formed on a surface of the transparent conductive film 9. The ITO film has transmittance of 95% and resistivity of $5 \times 10^{-4}$ Ω·cm below, for example. Any one of a ZnO (zinc oxide) film, a $Sn_2O$ (stannous oxide) film, an AZO (aluminum zinc oxide) film and an IZO (indium zinc oxide) film and the like may be used instead of the ITO film.

The concavo-convex shape formed in a surface of the N-type clad layer 6 and the transparent conductive film 9 changes variously an optical incident angle entered in surface side of the N-type clad layer 6 and an optical incident angle entered in surface side of the transparent conductive film 9. Therefore, an optical ratio reflected totally at an interface between the N-type clad layer 6 and the transparent conductive film 9, and an optical ratio reflected totally at interface between the transparent conductive film 9 and air decreases, it is enable to improve a light-extraction efficiency by formation of the concavo-convex shape.

As shown in FIG. 2, in the semiconductor light emitting device 90 of the embodiment, a hole generates totally at one side of the p-side electrode 7 side when a voltage is applied between the p-side electrode 7 and the n-side electrode 8, and the hole is supplied to a recombination generation region 50 which is formed totally at one side of the MQW light emitting layer 4. On the other hand, as a resistance of the transparent conductive film 9 is lower than that of the N-type clad layer 6, an electron generated in the N-side electrode 8 side propagates totally at one side of the superlattice layer 5 via the transparent conductive film 9 and the n-side electrode 8, and the electron is supplied to a recombination generation region 50 which is formed totally at one side of the MQW light emitting layer 4. Consequently, it is enable to suppress an increase of a carrier density in an active layer.

Figure 5A:
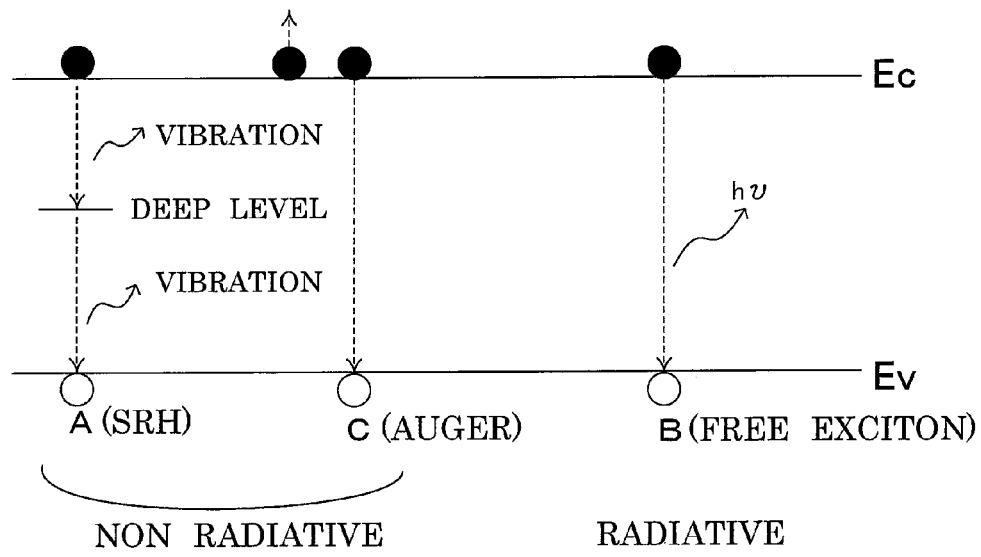
FIGS. 5a and 5b are views illustrating a radiation and a non radiation generated by a light emitting device according to the first embodiment.

Here, the descriptions will be provided for a radiation and a non radiation generated by a semiconductor light emitting device. As shown in FIG. 5(a), a radiation B caused by a spontaneous emission is light generated when an electron moves from a valence band to a conduction band and then radiates energy. A binding fraction is proportional to the square of a carrier. A non radiation A caused by a SRH (Shockley-Read-Hall recombination) radiates energy as a vibration when an electron moves from a conduction band to a deep level, or moves from a deep level to a valence band. A binding fraction is proportional to a carrier. A non radiation C caused by a non radiative Auger recombination radiates energy when an electron moves from a conduction band to a valence band, or excites when an electron catches energy in the conduction band. A binding fraction is proportional to the cube of a carrier.

Figure 5B:
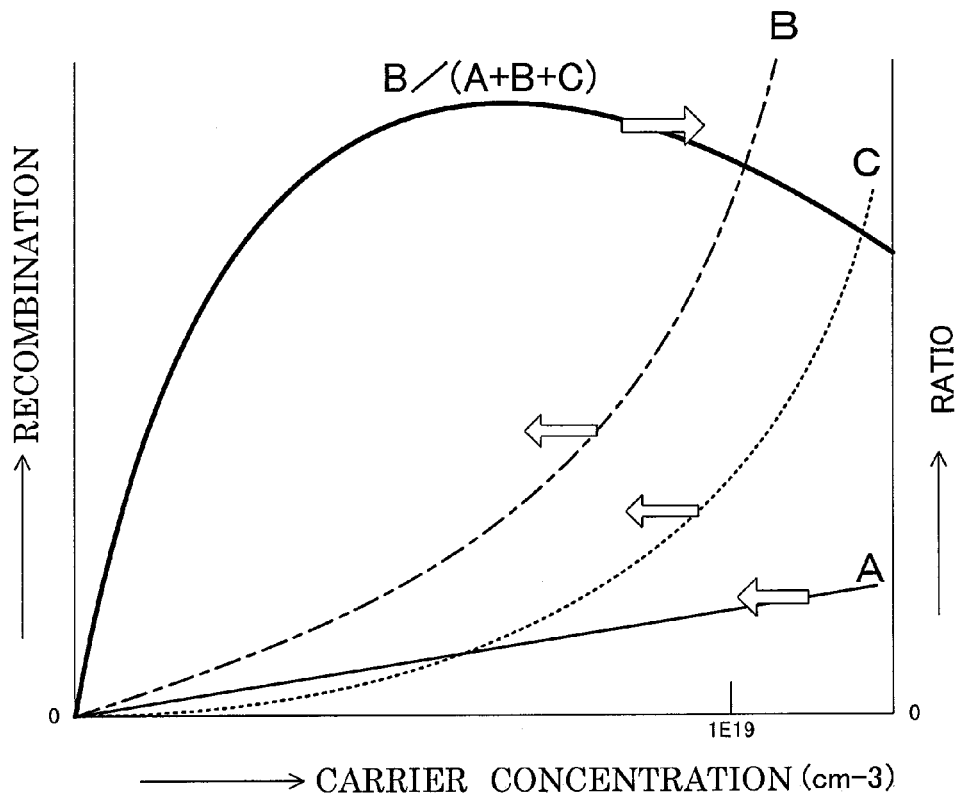

As shown in FIG. 5(b), the relationship of a ratio Y as a light emitting efficiency, the non radiation A, the radiation B and the non radiation C is shown as follows:

$$Y=B/(A+B+C) \qquad \text{Expression (1)}$$

The ratio Y as a light emitting efficiency increases with the increased amount of the carrier concentration. A value of the ratio Y is saturated when a carrier concentration reaches $4E18/cm^3$, and decreases gradually when the carrier concentration increases more than $4E18/cm^3$. In other words, the light emitting efficiency decreases in a region where the carrier concentration has more than a predetermined value.

It is possible to suppress the carrier concentration within the predetermined value when the semiconductor light emitting device 90 of the embodiment operates in a high-current region. In the case where the semiconductor light emitting device 90 of the embodiment operates in a high-current region, the recombination generates in wide region, it is possible to suppress the recombination to increase a carrier density of an active layer. Therefore, it is possible to suppress generation of the overflow and the non radiative Auger recombination, and to maintain the light emitting efficiency, and to increase an optical output in high-current region.

As shown in FIG. 3, a semiconductor light emitting device 100 of a comparative example includes the supporting board 11, the p-side supporting board electrode 12, the n-side supporting board electrode 13, the p-side electrode 7, the n-side electrode 8 and the stacked structure 61. The semiconductor light emitting device 100 of a comparative example does not include the transparent conductive film 9 of the semiconductor light emitting device 90 of the embodiment, other configurations is identical to the semiconductor light emitting device 90.

As shown in FIG. 4, in the semiconductor light emitting device 100 of the comparative example, a hole generates totally at one side of the p-side electrode 7 side when a voltage is applied between the p-side electrode 7 and the n-side electrode 8, and the hole is supplied totally at one side of the MQW light emitting layer 4. On the other hand, the N-type clad layer 6 has a comparatively high-value resistance, an electron generated in the n-side electrode 8 side is supplied only to a region of the N-type clad layer 6 near to the n-side electrode 8 side. Consequently, the recombination generation region 50 generates only in a region near to the n-side electrode 8 side.

Therefore, the recombination generates in narrow region when the semiconductor light emitting device 100 of the comparative example operates in a high-current region, a current concentrates and a carrier density of an active layer increases. Accordingly, the overflow and the non radiative Auger recombination generates, the light emitting efficiency decreases.

Next, descriptions will be provided for a method for manufacturing a semiconductor light emitting device with reference to FIGS. 6 to 9. FIGS. 6 to 9 are cross-sectional views showing the respective steps for manufacturing the light emitting device.

Figure 6:
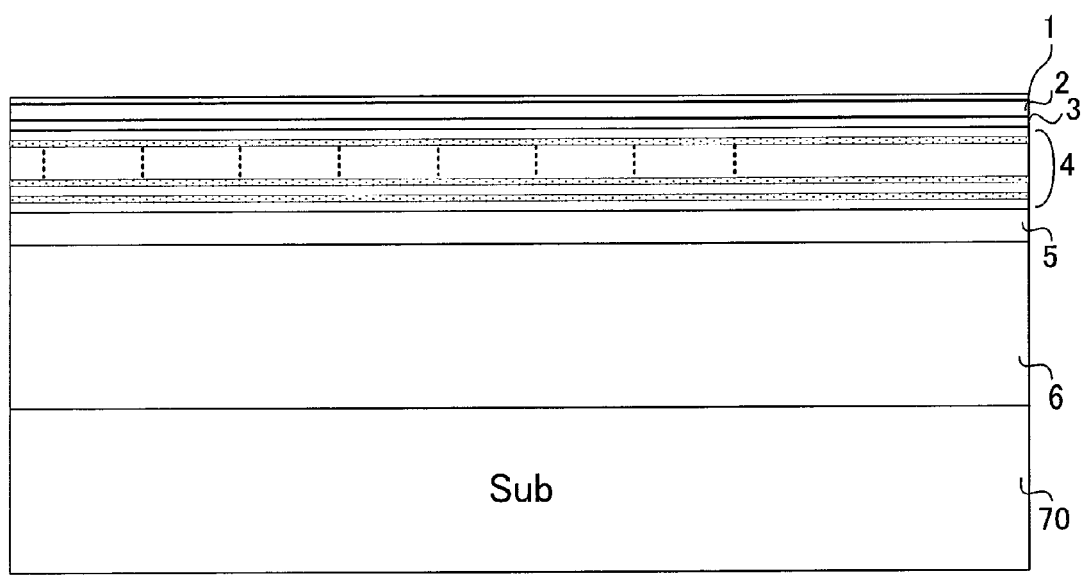
FIG. 6 is a cross-sectional view showing one of the steps for manufacturing the semiconductor light emitting device according to the first embodiment.

To begin with, a substrate 70 is prepared as shown in FIG. 6. Here, the substrate 70 is made of sapphire (Al$_2$O$_3$), instead, however, may be made of silicon (Si). The N-type clad layer 6, the superlattice layer 5, the MQW light emitting layer 4, the P-type overflow suppressing layer 3, the P-type clad layer 2 and the P-type contact layer 1, which are epitaxial layers whose compositions are different from one another, are consecutively formed and stacked on the first principal surface of the substrate 70 by MOCVD which is an epitaxial growth method. Incidentally, MBE (molecular beam epitaxy) may be used instead of MOCVD.

Figure 7:
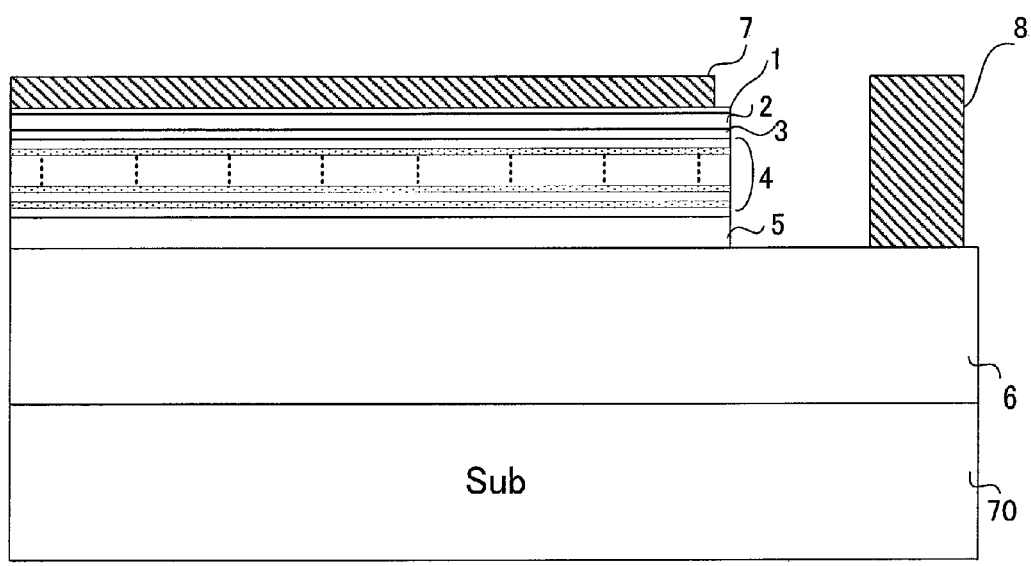
FIG. 7 is a cross-sectional view showing one of the steps for manufacturing the semiconductor light emitting device according to the first embodiment.

Next, as shown in FIG. 7, the P-type contact layer 1, the P-type clad layer 2, the overflow suppressing layer 3, the MQW light emitting layer 4 and the superlattice layer 5 is etched selectively so as to expose a surface of the N-type clad layer 6 at a right-side part in the view. The p-side electrode 7 is formed on the P-type contact layer 1 leaved, the n-side electrode 8 is formed on the N-type clad 6 exposed. At this time, it is preferable that an upside height of the p-side electrode 7 becomes equal to an upside height of the n-side electrode 8.

Figure 8:
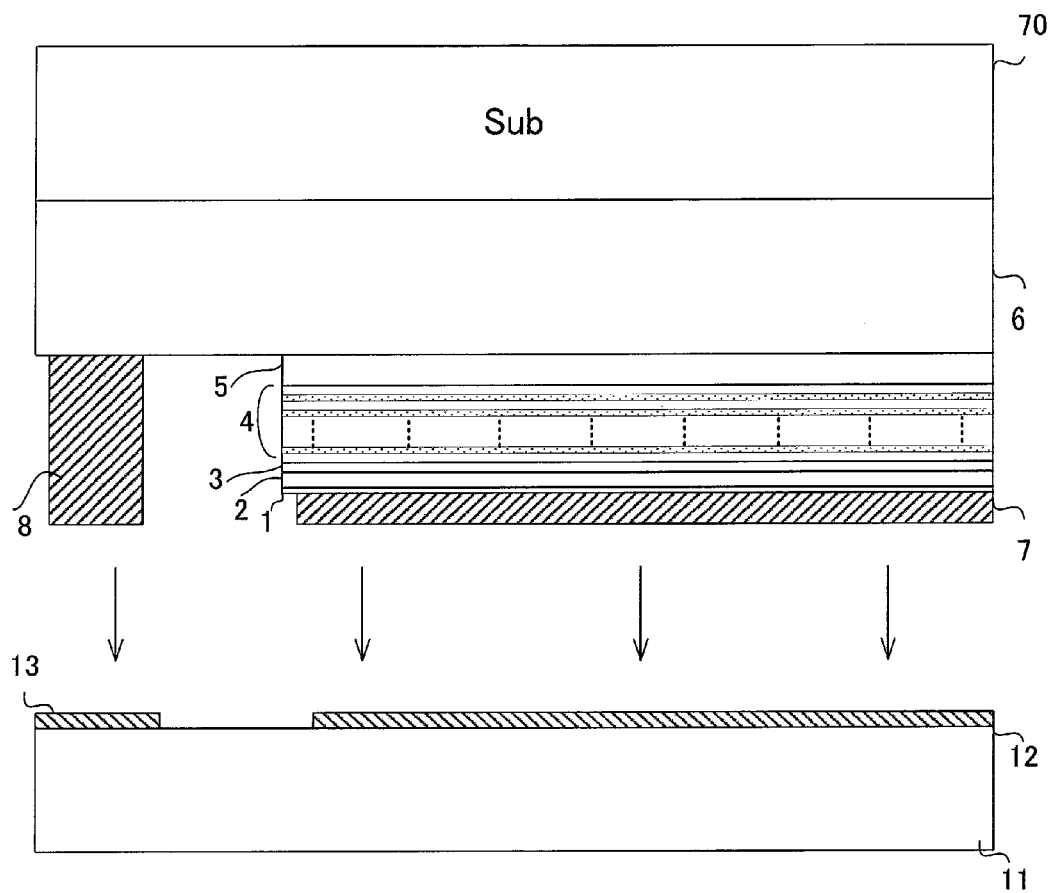
FIG. 8 is a cross-sectional view showing one of the steps for manufacturing the semiconductor light emitting device according to the first embodiment.

Subsequently, as shown in FIG. 8, the stacked structure 61 which is formed the p-side electrode 7 and the n-side electrode 8 is provided on a principal surface of the supporting board 11 and is bonded to the supporting board 11. At this time, the p-side electrode 7 is bonded to the p-side supporting board electrode 12, the n-side electrode 8 is bonded to the n-side supporting board electrode 13.

Figure 9:
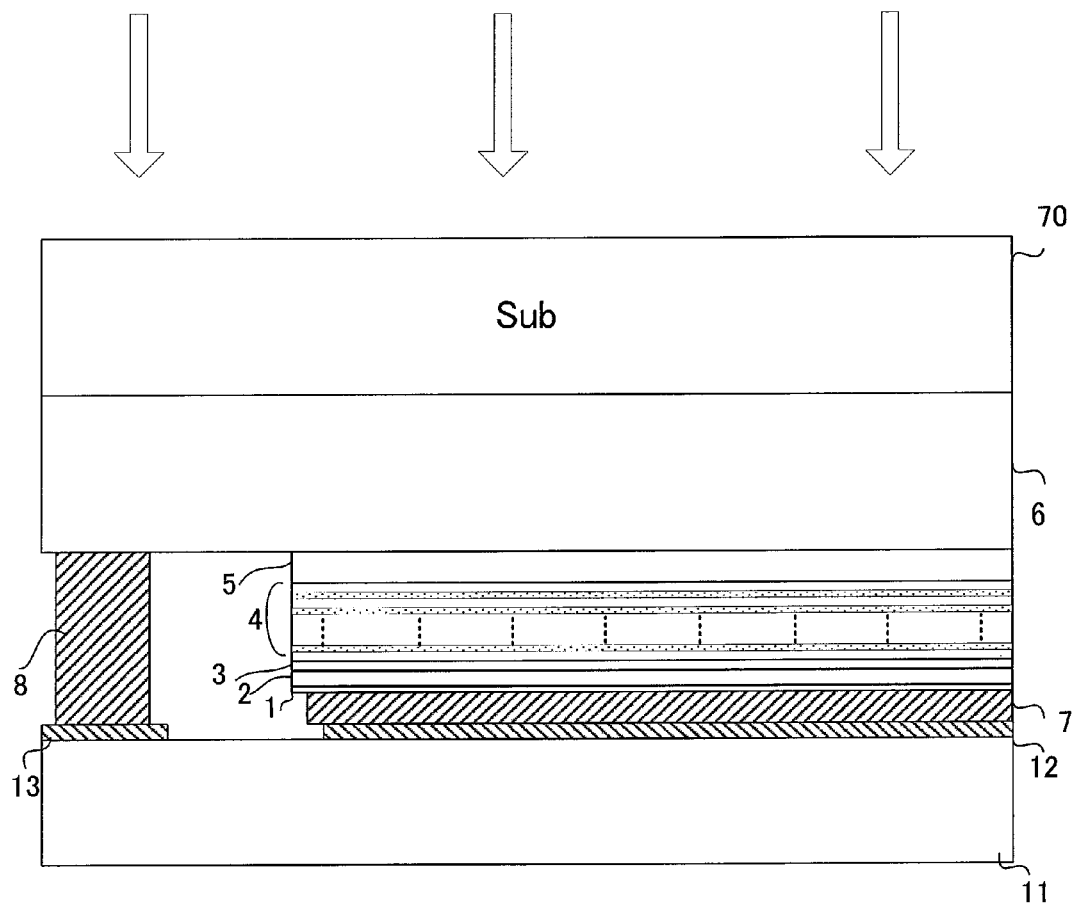
FIG. 9 is a cross-sectional view showing one of the steps for manufacturing the semiconductor light emitting device according to the first embodiment.

Next, as shown in FIG. 9, the substrate 70 is irradiated with a laser beam from the second principal surface (back surface) side opposed to the first principal surface side of the substrate 70. The laser beam is applied to laser liftoff for detaching the substrate 70 from the stacked structure 61 inclusive of the N-type clad layer 6. A titanium-sapphire laser beam, for example, is used as the laser beam. Conditions employed for the laser beam include an 800-nanometer wavelength and a 100-femtosecond pulse width. Because the substrate 70 made of sapphire (Al$_2$O$_3$) transmits the laser beam, a portion of the N-type clad layer 6 made of GaN, which is closer to the interface of the substrate 70, is decomposed into metallic Ga (gallium) and N$_2$ (nitrogen) by the laser beam. A portion of the substrate 70 made of sapphire (Al$_2$O$_3$), which is closer to the interface with the N-type clad layer 6, is melted by heat which is produced in conjunction with the decomposition as well. As a result, in the portion of the substrate 70 made of sapphire (Al$_2$O$_3$), an altered region is generated, and a detachment interface is formed. After the laser irradiation, the substrate 70 is detached from the stacked structure 61 with the N-type clad layer 6 along the detachment interface by heating and cooling, for example. In this respect, the substrate 70 is detached by laser liftoff. Instead, however, the substrate 70 may be removed by etching. In the case where silicon (Si) is used for the substrate 70, it is preferable that the substrate 70 is removed by etching.

Subsequently, a concavo-convex shape is formed in a surface of the N-type clad layer 6 exposed. The transparent conductive film 9 is formed on the N-type clad layer 6 which the concavo-convex shape is formed. Thereby, the semiconductor light emitting device 90 is completed.

Figure 10:
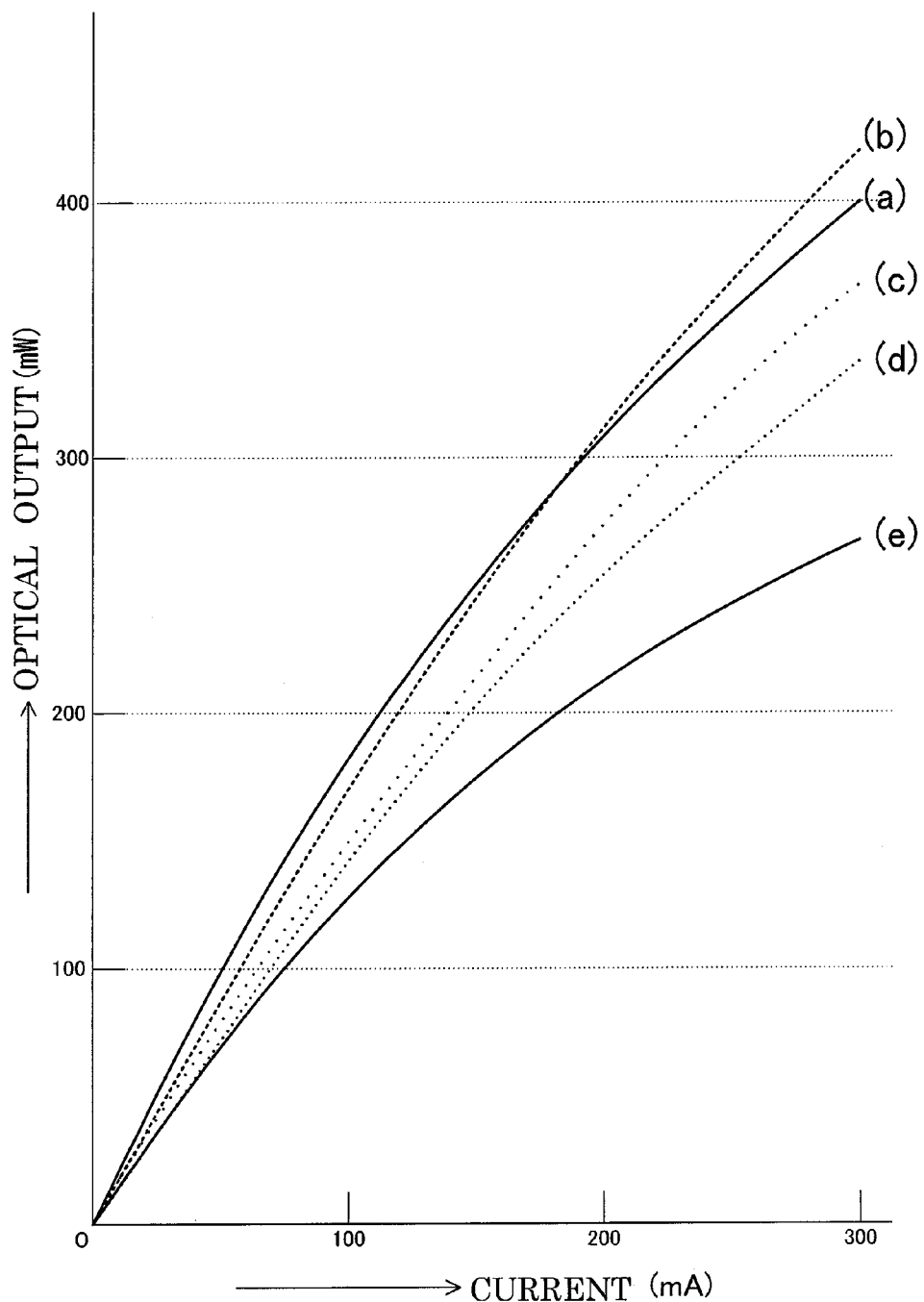
FIG. 10 is a view illustrating a relationship between a current and an optical output of the semiconductor light emitting device according to the first embodiment.
Figure 11:
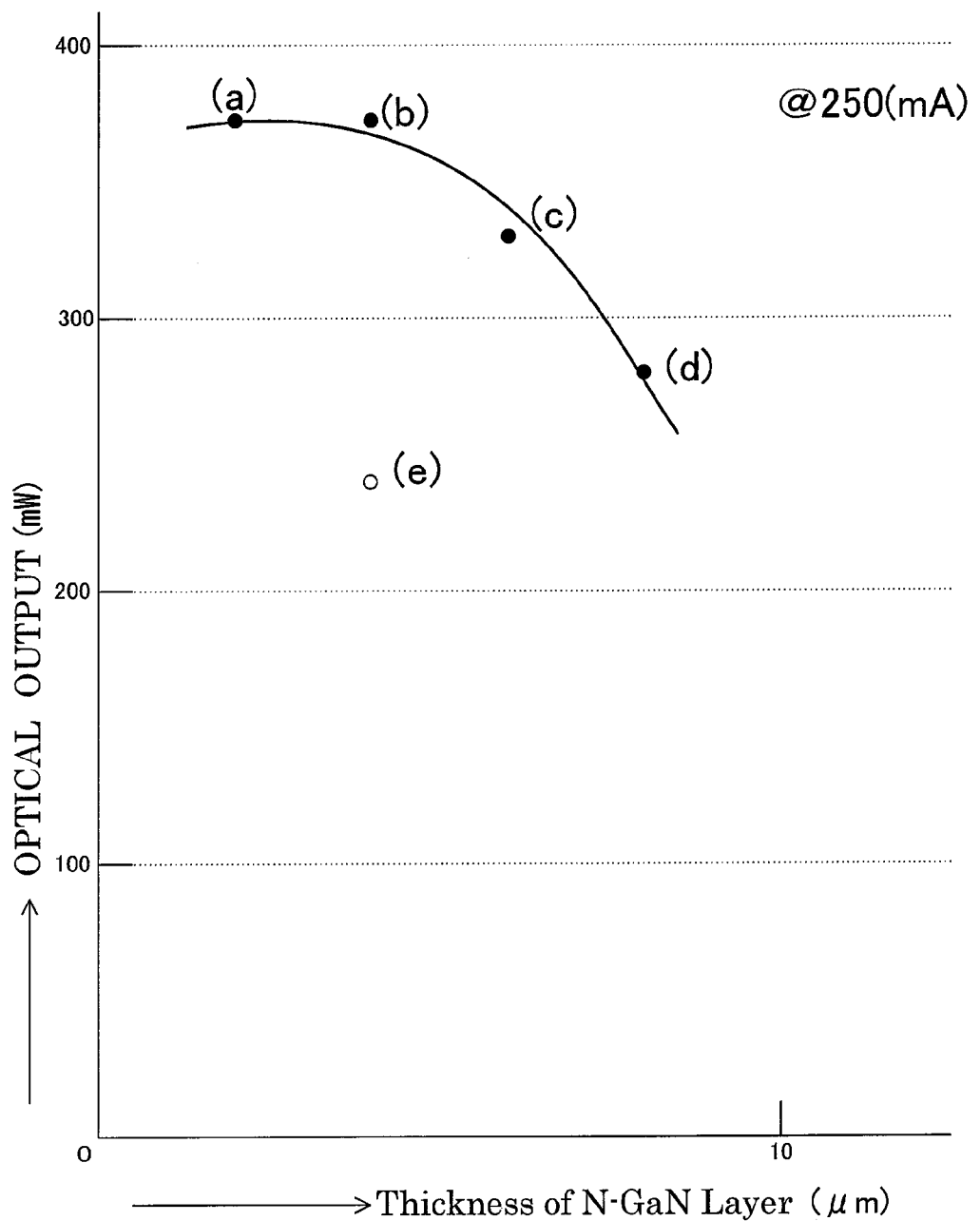
FIG. 11 is a view illustrating a relationship between a film thickness of an N-type clad layer and an optical output of the semiconductor light emitting device according to the first embodiment.
Figure 12:
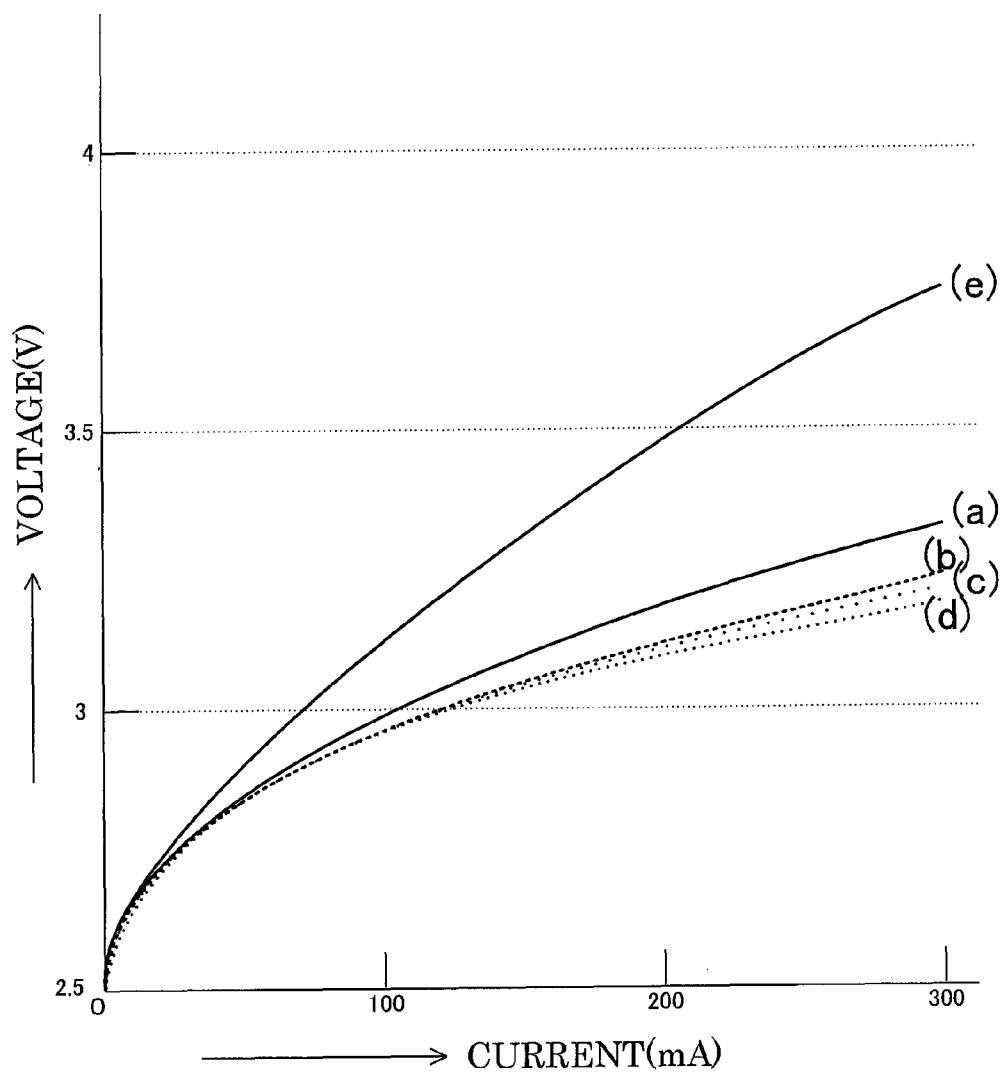
FIG. 12 is a view illustrating a relationship between a current and a voltage of the semiconductor light emitting device according to the first embodiment.

Next, descriptions will be provided for characteristics of a semiconductor light emitting device with reference to FIGS. 10 to 12. FIG. 10 is a view illustrating a relationship between a current and an optical output of the semiconductor light emitting device. FIG. 11 is a view illustrating a relationship between a film thickness of an N-type clad layer and an optical output of the semiconductor light emitting device. FIG. 12 is a view illustrating a relationship between a current and a voltage of the semiconductor light emitting device.

As shown in FIG. 10, an optical output increases with increasing a current flowing into a semiconductor light emitting device. Here, a solid line (a), a dashed line (b), a dashed line (c) and a dashed line (d) show characteristics of the embodiment, respectively. A solid line (e) shows characteristics of the comparative example. In the solid line (a), a film thickness of the N-type clad layer 6 is set 2 μm. In the dashed line (b) and the solid line (e), a film thickness of the N-type clad layer 6 is set 4 μm. In the dashed line (c), a film thickness of the N-type clad layer 6 is set 6 μm. In the dashed line (d), a film thickness of the N-type clad layer 6 is set 8 μm. In addition, a similar notation in FIGS. 11, 12 is used.

It is possible to increase an optical output of the semiconductor light emitting device 90 of the embodiment larger than that of the semiconductor light emitting device 100 of the comparative example. In particular, a large optical output is obtained at the solid line (a) in which a film thickness of the N-type clad layer 6 is set 2 μm and at the dashed line (b) in which a film thickness of the N-type clad layer 6 is set 4 μm.

As shown in FIG. 11, from a relationship between a film thickness of the N-type clad layer 6 of a semiconductor light emitting device and an optical output at 250 mA, for example, the optical output decreases when a film thickness of the N-type clad layer 6 is set larger than 4 μm, a large optical output is obtained when a film thickness of the N-type clad layer 6 is set to be equal to or below 4 μm. For this reason, the transparent conductive film 9 moves away from the n-side electrode 8 when a film thickness of the N-type clad layer 6 is set a large value, it is difficult that an electron reaches for the transparent conductive film 9. In the case of MOCVD and the like, it is possible to reduce a film thickness of a crystal growth layer. For this reason, it is enable to shorten crystal growth time, and to reduce warpage of a substrate which is generated by a difference of coefficient of thermal expansion after a crystal growth.

As show in FIG. 12, in the semiconductor light emitting device 90 (the solid line (a), the dashed line (b), the dashed line (c) and the dashed line (d)) of the embodiment, it is possible to increase an optical output at low voltage larger than the semiconductor light emitting device 100 (the solid line (e)) of the comparative example.

As described above, the semiconductor light emitting device of the embodiment includes the supporting board 11, the p-side supporting board electrode 12, the n-side supporting board electrode 13, the p-side electrode 7, the n-side electrode 8, the stacked structure 61 and the transparent conductive film 9. The stacked structure 61 includes the P-type contact layer 1, the P-type clad layer 2, the P-type overflow suppressing layer 3, the MQW light emitting layer 4, the superlattice layer 5 and the N-type clad layer 6. In the semiconductor light emitting device 90, the p-side electrode 7 and the n-side electrode 8 is provided on the supporting board 11 side, light generated in the MQW light emitting layer 4 of the stacked structure 61 is taken out from the N-type clad layer 6 side. The transparent conductive film 9 is provided so as to cover the N-type clad layer 6 on the N-type clad layer 6 as the upper layer of the stacked structure 61. A concavo-convex shape is provided in a surface of the N-type clad layer 6 and the transparent conductive film 9.

Accordingly, when the semiconductor light emitting device 90 of the embodiment operates in a high-current region, the recombination generates in wide region, it is possible to suppress to increase a carrier density of an active layer. Therefore, it is possible to suppress generation of the overflow and the non radiative Auger recombination, and to increase an optical output in high-current region. Moreover, it is enable to shorten crystal growth time, and to increase an optical output in large current region. It is possible to reduce a film thickness of a crystal growth layer. For this reason, it is enable to shorten crystal growth time, and to reduce warpage of a substrate which is generated by a difference of coefficient of thermal expansion after a crystal growth.

It should be noted that although the semiconductor light emitting device uses for a GaN LED in the embodiment, the invention is not limited to the above case. The semiconductor light emitting device may use for an AlGaAs LED and an InGaAlP LED.

In the embodiment, the stacked structure 61 includes the P-type contact layer 1 (a first semiconductor layer), the P-type clad layer 2, the P-type overflow suppressing layer 3, the MQW light emitting layer 4 (a light emitting layer), the superlattice layer 5 and the N-type clad layer 6 (a second semiconductor layer) are formed and stacked. It should be noted that although the P-type clad layer 2 and the P-type overflow suppressing layer 3 are provided between the P-type contact layer 1 (a first semiconductor layer) and the MQW light emitting layer 4 (a light emitting layer), the superlattice layer 5 is provided between the MQW light emitting layer 4 (a light emitting layer) and the N-type clad layer 6 (a second semiconductor layer), the invention is not limited to the above case. A stacked structure may include a P-type contact layer (a first semiconductor layer), a MQW light emitting layer and an N-type contact layer (a second semiconductor layer), for example. In this structure, it is enable to suppress generation of an overflow and a non radiative Auger recombination.

Figure 13:
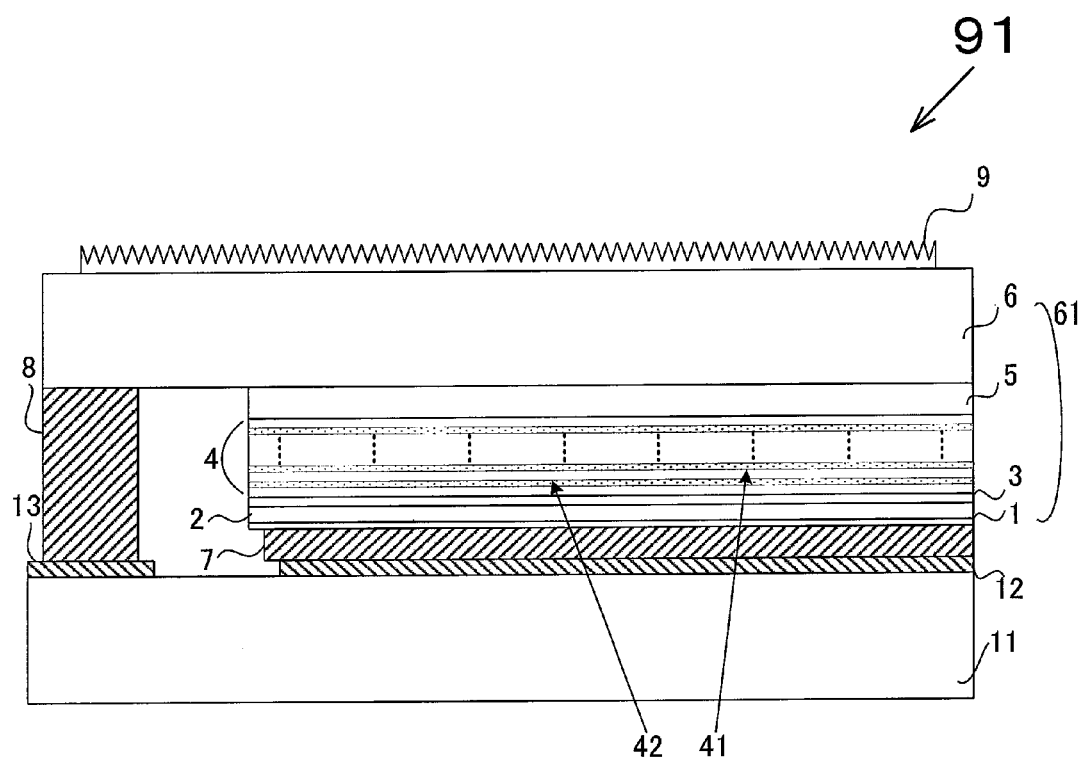
FIG. 13 is a cross-sectional view showing a semiconductor light emitting device according to a second embodiment.

Descriptions will be provided for a semiconductor light emitting device of a second embodiment with reference to FIG. 13. FIG. 13 is a cross-sectional view showing the semiconductor light emitting device. In the embodiment, a surface of an N-type clad layer becomes planarized.

Hereinafter, a portion with the same configuration in the first embodiment is provided with the same numeral, a description of the portion will not be repeated, and only a portion with a different configuration is described.

As shown in FIG. 13, a semiconductor light emitting device 91 includes the supporting board 11, the p-side supporting board electrode 12, the n-side supporting board electrode 13, the p-side electrode 7, the n-side electrode 8, the stacked structure 61 and the transparent conductive film 9. The semiconductor light emitting device 91 differs from the semiconductor light emitting device 90 of the first embodiment at the points where a surface of the N-type clad layer 6 becomes planarized, and a concavo-convex shape is formed in a surface of the transparent conductive film 9.

The transparent conductive film 9 is made of an ITO film in which a film thickness is set 0.17 μm. In the concavo-convex shape formed on a surface of the transparent conductive film 9, a thickness of a concavo portion is set larger than 0.1 μm, intervals and a film thickness is set to be in the same league, for example. The concavo-convex shape formed on a surface of the transparent conductive film 9 is formed using mixed acid made of hydrochloric acid and nitric acid. Incidentally, CDE (chemical dry etching) or RIE (reactive ion etching) may be used instead of mixed acid made of hydrochloric acid and nitric acid.

In the semiconductor light emitting device 91 of the embodiment, the transparent conductive film 9 is formed on the N-type clad layer 6 with a flattened structure. Therefore, it is easy to form the transparent conductive film 9 than the semiconductor light emitting device 90 of the first embodiment. Moreover, in the semiconductor light emitting device 91 of the embodiment, a concavo-convex shape is not provided in a surface of the N-type clad layer 6. Therefore, it is enable to shorten manufacturing steps than the semiconductor light emitting device 90 of the first embodiment.

As described above, the semiconductor light emitting device of the embodiment includes the supporting board 11, the p-side supporting board electrode 12, the n-side supporting board electrode 13, the p-side electrode 7, the n-side electrode 8, the stacked structure 61 and the transparent conductive film 9. The transparent conductive film 9 having a concavo-convex shape in a surface is formed so as to cover the N-type clad layer 6 with a flattened structure in a surface.

Accordingly, the embodiment can bring about the same effects as close the first embodiment, and additionally can make it possible to form the transparent conductive film 9 than the first embodiment. Moreover, it is enable to shorten manufacturing steps of the semiconductor light emitting device 91.

Figure 14:
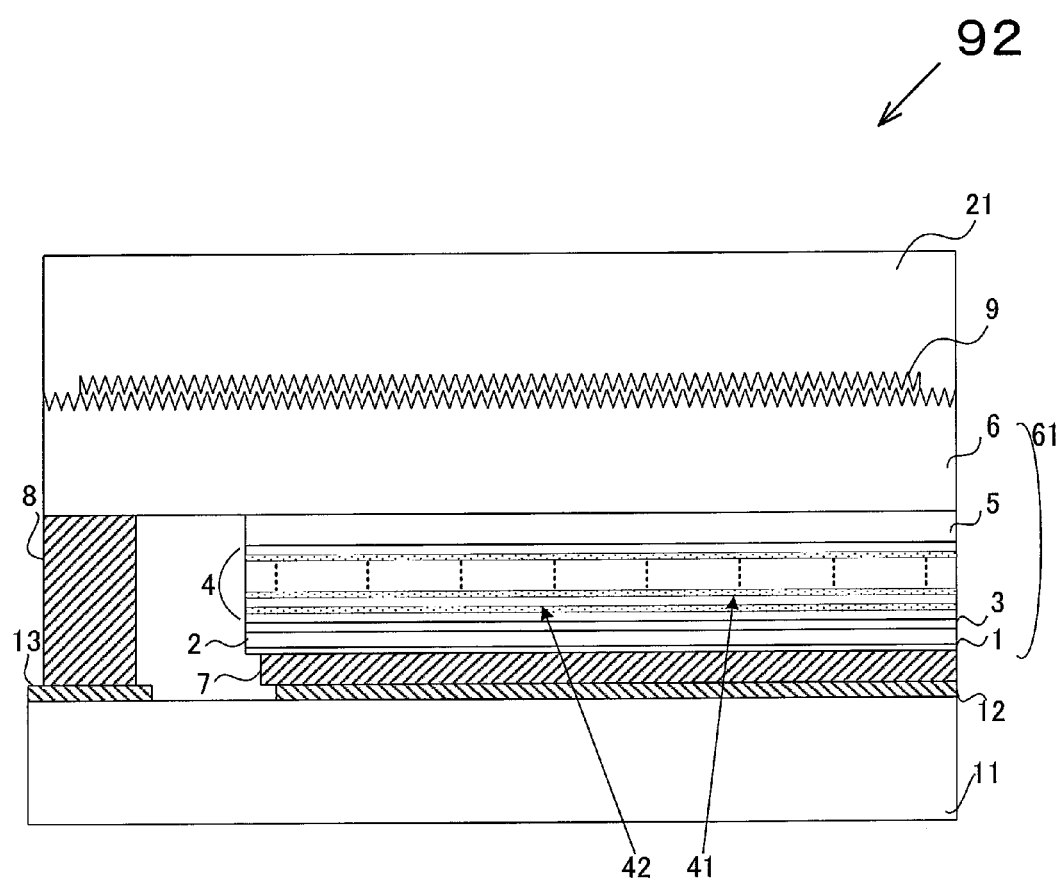
FIG. 14 is a cross-sectional view showing a semiconductor light emitting device according to a third embodiment.

Descriptions will be provided for a semiconductor light emitting device of a third embodiment with reference to FIG. 14. FIG. 14 is a cross-sectional view showing the semiconductor light emitting device. In the embodiment, a translucent resin is provided on a transparent conductive film.

Hereinafter, a portion with the same configuration in the first embodiment is provided with the same numeral, a description of the portion will not be repeated, and only a portion with a different configuration is described.

As shown in FIG. 14, a semiconductor light emitting device 92 includes the supporting board 11, the p-side supporting board electrode 12, the n-side supporting board electrode 13, the p-side electrode 7, the n-side electrode 8, the stacked structure 61, the transparent conductive film 9 and a translucent resin 21. The semiconductor light emitting device 92 differs from the semiconductor light emitting device 90 of the first embodiment at the point where the translucent resin 21 is provided on a surface of the transparent conductive film 9.

The translucent resin 21 is provided so as to cover a surface of the transparent conductive film 9. The translucent resin 21 is a white silicone resin with a fluorescent substance, and wavelength-converts light outputted from the transparent conductive film 9 into white light. Consequently, the white light is taken out from a surface side of the translucent resin 21.

As described above, the semiconductor light emitting device of the embodiment includes the supporting board 11, the p-side supporting board electrode 12, the n-side supporting board electrode 13, the p-side electrode 7, the n-side electrode 8, the stacked structure 61, the transparent conductive film 9 and the translucent resin 21. The translucent resin 21 wavelength-converts light outputted from the transparent conductive film 9 into white light.

Accordingly, the embodiment can bring about the same effects as dose the first embodiment, and additionally can make it possible to take out light wavelength-converted in the semiconductor light emitting device 92.

Figure 15:
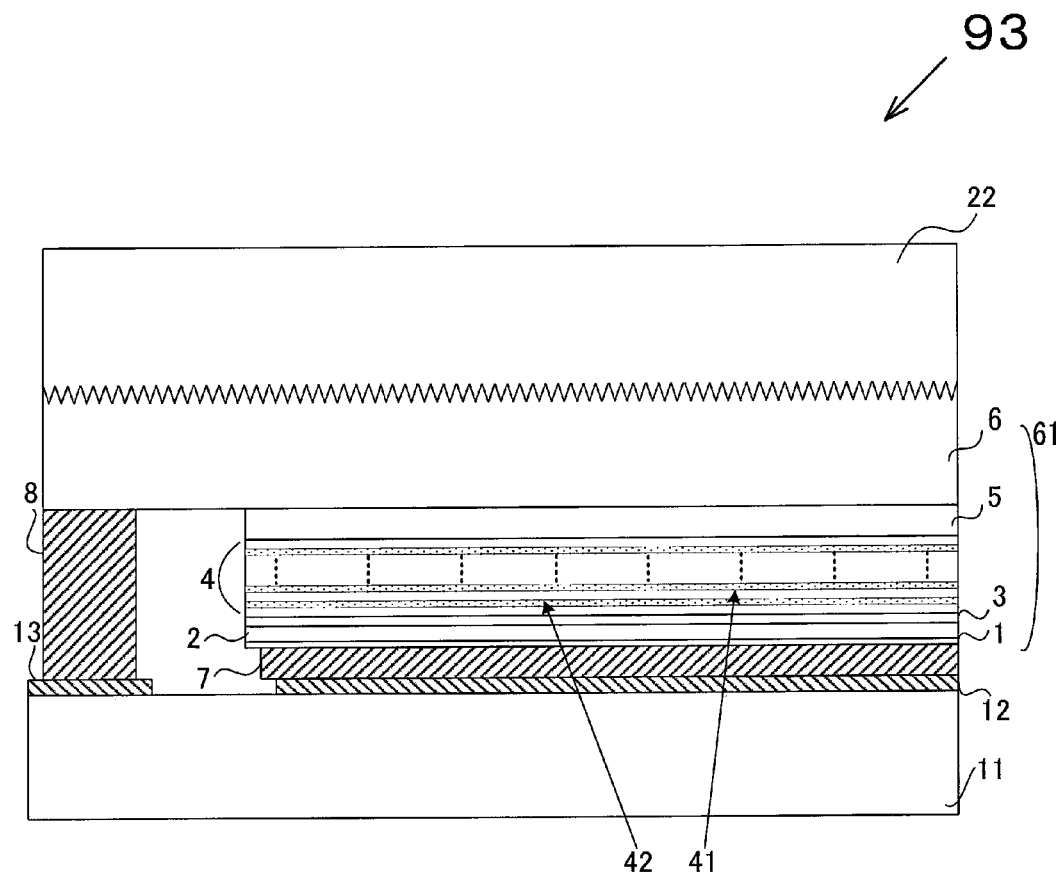
FIG. 15 is a cross-sectional view showing a semiconductor light emitting device according to a forth embodiment.

Descriptions will be provided for a semiconductor light emitting device of a forth embodiment with reference to FIG. 15. FIG. 15 is a cross-sectional view showing the semiconductor light emitting device. In the embodiment, a translucent conductive resin is provided on an N-type clad layer.

Hereinafter, a portion with the same configuration in the first embodiment is provided with the same numeral, a description of the portion will not be repeated, and only a portion with a different configuration is described.

As shown in FIG. 15, a semiconductor light emitting device 93 includes the supporting, board 11, the p-side supporting board electrode 12, the n-side supporting board electrode 13, the p-side electrode 7, the n-side electrode 8, the stacked structure 61, and a translucent conductive resin 22. The semiconductor light emitting device 93 differs from the semiconductor light emitting device 90 of the first embodiment at the point where the translucent conductive resin 22 is provided on a surface of the N-type clad layer 6 instead of the transparent conductive film 9.

The translucent conductive resin 22 does not include rare metal such as indium (In) contained in an ITO film and the like, and is used as an alternative material of the ITO film and the like. A film thickness of the translucent conductive resin 22 is set from a few μm to 100 μm. In translucent conductive resin 22, derivative of polythiophene is used, however, any one of derivative of polyphenylene, derivative of polyaniline and derivative of polypyrrole may be used instead of the derivative of polythiophene. Moreover, metallic carbon nanotube is added in the above-mentioned materials.

It is enable to increase a thickness of a resin relatively when the translucent conductive resin 22 is used instead of the transparent conductive film 9. Consequently, it is possible to spread carrier even in the cases where elctroconductivity is relatively low. Moreover, the translucent conductive resin 22 includes a fluorescent substance, therefore, in the semiconductor light emitting device 93, it is enable to taken out white light wavelength-converted.

As described above, the semiconductor light emitting device of the embodiment includes the supporting board 11, the p-side supporting board electrode 12, the n-side supporting board electrode 13, the p-side electrode 7, the n-side electrode 8, the stacked structure 61 and the translucent conductive resin 22. The translucent conductive resin 22 is used as an alternative material of the transparent conductive film 9, and includes a fluorescent substance.

Accordingly, the embodiment can bring about the same effects as dose the first embodiment, and additionally can make it possible to relatively increase a film thickness of the translucent conductive resin 22. Moreover, it is possible to taken out white light wavelength-converted in the semiconductor light emitting device 93.

While certain embodiments have been described, these embodiments have been presented by way of example only, and are not intend to limit the scope of the inventions. Indeed, the novel embodiments described herein may be embodied in a variety of the other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
a stacked structure including a first semiconductor layer with a first conductivity type, a light emitting layer, and a second semiconductor layer with a second conductivity type, the respective layers being stacked directly or indirectly on each other;
a first electrode connected to the first semiconductor layer;
a second electrode disposed on a first surface of the second semiconductor layer, the first surface of the second semiconductor layer being a flat surface;
a first plurality of concavo-convex shapes provided in a second surface of the second semiconductor layer, the second surface of the second semiconductor layer being opposite to the first surface of second semiconductor layer; and
a transparent conductive film having a third surface disposed on and in contact with the first plurality of concavo-convex shapes provided in the second surface of the second semiconductor layer, the transparent conductive film having a fourth surface that is opposite the third surface and a second plurality of concavo-convex shapes provided in the fourth surface, wherein
the second plurality of concavo-convex shapes corresponds to the first plurality of concavo-convex shapes, and
opposing surfaces of both the first semiconductor layer and the light emitting layer are flat surfaces.

2. The semiconductor light emitting device according to claim 1, further comprising:
a translucent resin contacting the transparent conductive film such that the transparent conductive film is between the translucent resin and the second semiconductor layer.

3. The semiconductor light emitting device according to claim 1, wherein the transparent conductive film comprises any one of an ITO film, a ZnO film, a $Sn_2O$ film, an AZO film and an IZO film.

4. The semiconductor light emitting device according to claim 1, wherein the light emitting layer has a MQW (multiple quantum well) structure in which barrier layers and well layers are alternately provided in a stacking direction.

5. The semiconductor light emitting device according to claim 1, wherein a clad layer having the first conductivity type and an overflow suppressing layer are between the first semiconductor layer and the light emitting layer, and a superlattice layer is between the light emitting layer and the second semiconductor layer.

6. The semiconductor light emitting device according to claim 1, wherein the first electrode does not extend beyond the first semiconductor layer in a direction perpendicular to a stacking direction.

7. The semiconductor light emitting device according to claim 1, wherein a film thickness of the second semiconductor layer is equal to or below 4 μm.

8. The semiconductor light emitting device according to claim 1, wherein the first electrode and the second electrode are provided on a supporting board.

9. The semiconductor light emitting device according to claim 1, wherein the semiconductor light emitting device is any of a GaN LED, an AlGaAs LED and an InGaAsP LED.

10. A semiconductor light emitting device, comprising:
 a stacked structure including a first semiconductor layer with a first conductivity type, a light emitting layer, and a second semiconductor layer with a second conductivity type, the respective layers being stacked directly or indirectly on each other;
 a first electrode connected to the first semiconductor layer;
 a second electrode disposed on a first surface of the second semiconductor layer; and
 a translucent conductive resin disposed on and in contact with a second surface of the second semiconductor layer which is opposite to the first surface of the second semiconductor layer, wherein
 the translucent conductive resin contains a fluorescent substance,
 a plurality of concavo-convex shapes is provided in the second surface of the second semiconductor layer, and
 a film thickness of the second semiconductor layer is equal to or more than 2 μm, and to be equal to or lower than 4 μm.

11. The semiconductor light emitting device according to claim 10, wherein the translucent conductive resin comprises any one of a polythiophene resin, a polyphenylene vinylene resin, a polyaniline resin and a polypyrrole resin.

12. The semiconductor light emitting device according to claim 10, wherein the first electrode does not extend beyond the first semiconductor layer in a direction perpendicular to a stacking direction.

13. The semiconductor light emitting device according to claim 10, wherein the first electrode and the second electrode are provided on a supporting board.

14. The semiconductor light emitting device according to claim 10, wherein the semiconductor light emitting device is any of a GaN LED, an AlGaAs LED and an InGaAsP LED.

* * * * *